United States Patent
Vincent et al.

(10) Patent No.: US 9,263,420 B2
(45) Date of Patent: Feb. 16, 2016

(54) DEVICES AND STACKED MICROELECTRONIC PACKAGES WITH PACKAGE SURFACE CONDUCTORS AND METHODS OF THEIR FABRICATION

(71) Applicants: Michael B. Vincent, Chandler, AZ (US); Scott M. Hayes, Chandler, AZ (US)

(72) Inventors: Michael B. Vincent, Chandler, AZ (US); Scott M. Hayes, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/097,424

(22) Filed: Dec. 5, 2013

(65) Prior Publication Data
US 2015/0162309 A1    Jun. 11, 2015

(51) Int. Cl.
*H01L 25/065*    (2006.01)
*H01L 25/00*    (2006.01)
*H01L 23/31*    (2006.01)
*H01L 21/56*    (2006.01)
*H01L 23/00*    (2006.01)

(52) U.S. Cl.
CPC .......... *H01L 25/0657* (2013.01); *H01L 21/561* (2013.01); *H01L 23/3114* (2013.01); *H01L 24/19* (2013.01); *H01L 24/96* (2013.01); *H01L 25/50* (2013.01); *H01L 2225/06524* (2013.01); *H01L 2225/06551* (2013.01)

(58) Field of Classification Search
USPC ....................................................... 257/777
See application file for complete search history.

(56) References Cited

U.S. PATENT DOCUMENTS

| | | | |
|---|---|---|---|
| 4,866,501 | A | 9/1989 | Shanefield |
| 5,019,946 | A | 5/1991 | Eichelberger et al. |
| 5,279,991 | A | 1/1994 | Minahan et al. |
| 5,432,729 | A | 7/1995 | Carson et al. |
| 5,465,186 | A | 11/1995 | Bajorek et al. |
| 5,675,180 | A | 10/1997 | Pedersen et al. |
| 5,847,448 | A | 12/1998 | Val et al. |
| 5,977,640 | A | 11/1999 | Bertin et al. |
| 6,467,880 | B2 | 10/2002 | Rhodes |
| 6,560,109 | B2 | 5/2003 | Yamaguchi et al. |
| 6,607,941 | B2 | 8/2003 | Prabhu et al. |
| 6,674,159 | B1 * | 1/2004 | Peterson ............... B81B 7/0067 257/431 |
| 6,818,977 | B2 | 11/2004 | Poo et al. |
| 6,822,191 | B2 | 11/2004 | De Steur et al. |

(Continued)

OTHER PUBLICATIONS

Notice of Allowance mailed Feb. 3, 2015 for U.S. Appl. No. 14/042,628, 12 pages.

(Continued)

*Primary Examiner* — Thao P Le
(74) *Attorney, Agent, or Firm* — Sherry W. Schumm

(57) ABSTRACT

Embodiments of methods for forming a device include performing an oxidation inhibiting treatment to exposed ends of first and second device-to-edge conductors, and forming a package surface conductor to electrically couple the exposed ends of the first and second device-to-edge conductors. Performing the oxidation inhibiting treatment may include applying an organic solderability protectant coating to the exposed ends, or plating the exposed ends with a conductive plating material. The method may further include applying a conformal protective coating over the package surface conductor. An embodiment of a device formed using such a method includes a package body, the first and second device-to-edge conductors, the package surface conductor on a surface of the package body and extending between the first and second device-to-edge conductors, and the conformal protective coating over the package surface conductor.

14 Claims, 7 Drawing Sheets

(56) References Cited

U.S. PATENT DOCUMENTS

| | | | |
|---|---|---|---|
| 6,855,572 | B2 | 2/2005 | Jeung et al. |
| 7,394,152 | B2 | 7/2008 | Yu et al. |
| 7,560,215 | B2 | 7/2009 | Sharma et al. |
| 7,723,159 | B2 | 5/2010 | Do et al. |
| 7,732,907 | B2 | 6/2010 | Han et al. |
| 7,741,156 | B2 | 6/2010 | Pagaila et al. |
| 7,759,800 | B2 | 7/2010 | Rigg et al. |
| 7,829,998 | B2 | 11/2010 | Do et al. |
| 7,838,979 | B2 | 11/2010 | Oh |
| 7,843,046 | B2 | 11/2010 | Andrews et al. |
| 7,951,649 | B2 | 5/2011 | Val |
| 7,972,650 | B1 | 7/2011 | Church et al. |
| 7,994,621 | B2 | 8/2011 | Kim |
| 8,012,802 | B2 | 9/2011 | Sasaki et al. |
| 8,247,268 | B2 | 8/2012 | Do et al. |
| 8,362,621 | B2 | 1/2013 | Lee et al. |
| 8,796,561 | B1* | 8/2014 | Scanlan et al. ............ 174/534 |
| 9,093,457 | B2* | 7/2015 | Gong ............ H01L 23/3128 257/669 |
| 2002/0121702 | A1 | 9/2002 | Higgins, III |
| 2003/0138610 | A1 | 7/2003 | Tao |
| 2006/0043569 | A1 | 3/2006 | Benson et al. |
| 2008/0274603 | A1 | 11/2008 | Do et al. |
| 2009/0039528 | A1 | 2/2009 | Haba et al. |
| 2009/0134527 | A1 | 5/2009 | Chang |
| 2009/0160065 | A1 | 6/2009 | Haba et al. |
| 2009/0230533 | A1 | 9/2009 | Hoshino et al. |
| 2010/0001407 | A1 | 1/2010 | Krause et al. |
| 2010/0140811 | A1 | 6/2010 | Leal et al. |
| 2010/0270668 | A1 | 10/2010 | Marcoux |
| 2010/0320584 | A1 | 12/2010 | Takano |
| 2011/0012246 | A1 | 1/2011 | Andrews, Jr. et al. |
| 2011/0037159 | A1* | 2/2011 | McElrea et al. ............ 257/686 |
| 2011/0304011 | A1 | 12/2011 | Lee |
| 2012/0187577 | A1 | 7/2012 | Cordes et al. |
| 2012/0193785 | A1 | 8/2012 | Lin et al. |
| 2012/0313209 | A1* | 12/2012 | Oganesian ........ H01L 27/14618 257/443 |
| 2013/0010441 | A1 | 1/2013 | Oganesian et al. |
| 2013/0049225 | A1* | 2/2013 | Kang et al. ............ 257/774 |
| 2014/0054783 | A1 | 2/2014 | Gong et al. |
| 2014/0054797 | A1 | 2/2014 | Gong et al. |

OTHER PUBLICATIONS

Non-Final Office Action mailed Feb. 12, 2015 for U.S. Appl. No. 14/097,459, 16 pages.
Non-Final Office Action mailed Mar. 6, 2015 for U.S. Appl. No. 13/591,924, 8 pages.
Notice of Allowance mailed Feb. 17, 2015 for U.S. Appl. No. 13/591,990, 5 pages.
Notice of Allowance mailed Mar. 5, 2015 for U.S. Appl. No. 14/042,623, 14 pages.
Non-Final Office Action mailed Mar. 6, 2015 for U.S. Appl. No. 13/829,737, 11 pages.
U.S. Appl. No. 13/829,737, Office Action—Restriction, mailed May 23, 2014.
U.S. Appl. No. 13/829,737, Office Action—Pre-Interview Communication (Pilot Program), mailed Aug. 14, 2014.
Notice of Allowance mailed Apr. 2, 2015 for U.S. Appl. No. 13/591,969, 8 pages.
U.S. Appl. No. 13/591,969, Office Action—Rejection, mailed Sep. 13, 2013.
U.S. Appl. No. 13/591,990, Office Action—Rejection, mailed Jul. 5, 2013.
U.S. Appl. No. 13/591,990, Office Action—Rejection, mailed Dec. 19, 2013.
U.S. Appl. No. 13/591,924, Gong, Z., et al., "Stacked MicroElectronic Packages Having Sidewall Conductors and methods for the Fabrication Thereof", filed Aug. 22, 2012.
U.S. Appl. No. 13/591,969, Gong, Z., et al., "Stacked microelectronic Packages Having Patterned Sidewall Conductors and Methods for the Fabrication Thereof", filed Aug. 22, 2012.
U.S. Appl. No. 13/591,990, Vincent, M.B., et al., "Stacked Microelectronic Packages Having Sidewall Conductors and methods for the Fabrication Thereof", filed Aug. 22, 2012.
U.S. Appl. No. 13/906,621, Yap, W.F., et al., "Stacked Microelectronic Packages Having Sidewall Conductors and methods for the Fabrication Thereof", filed May 31, 2013.
U.S. Appl. No. 13/829,737, Yap, W.F., et al., "Stacked Microelectronic Packages Having Sidewall Conductors and Methods for the Fabrication Thereof", filed Mar. 14, 2013.
U.S. Appl. No. 14/042,628, Wright, J.R., et al., "Devices and Stacked Microelectronic Packages with In-Trench Package Surface Conductors and methods of Their Fabrication", filed Sep. 30, 2013.
U.S. Appl. No. 14/097,459, Vincent, M.B., et al., "Devices and Stacked Microelectronic Packages with Package Surface Conductors and Adjacent Trenches and Methods of Their Fabrication", filed Dec. 5, 2013.
U.S. Appl. No. 14/042,623, Vincent, M.B., et al., "Devices and Stacked Microelectronic Packages with Parallel Conductors and Intra-conductor Isolator Structures and Methods of Their Fabrication", filed Sep. 30, 2013.
Rabaey, J. et al., "Digital Integrated Circuits," Jan. 2003, Pearson Education, 2nd Ed. 38-40.
Restriction Requirement mailed Apr. 11, 2014 for U.S. Appl. No. 13/591,924, 9 pages.
Non-Final Office Action mailed Jul. 24, 2014 for U.S. Appl. No. 13/591,924, 16 pages.
Final Office Action mailed Nov. 19, 2014 for U.S. Appl. No. 13/591,924, 21 pages.
Final Office Action mailed Feb. 14, 2014 for U.S. Appl. No. 13/591,969 16 pages.
Final Office Action mailed Sep. 22, 2014 for U.S. Appl. No. 13/591,969 17 pages.
Notice of Allowance mailed Jan. 28, 2015 for U.S. Appl. No. 13/591,969 7 pages.
Restriction Requirement mailed Mar. 29, 2013 for U.S. Appl. No. 13/591,990, 4 pages.
Notice of Allowance mailed Jan. 8, 2015, for U.S. Appl. No. 13/591,990, 6 pages.
Non-Final Office Action mailed Nov. 18, 2014 for U.S. Appl. No. 13/906,621, 5 pages.
Final Office Action mailed Dec. 5, 2014 for U.S. Appl. No. 13/829,737, 10 pages.
U.S. Appl. No. 14/573,519, filed Dec. 17, 2014, entitled "Microelectronic Devices with Mutli-Layer Package Surface Conductors and Methods of Their Fabrication".
Notice of Allowance mailed May 19, 2015 for U.S. Appl. No. 13/591,924, 8 pages.
Final Office Action mailed May 12, 2015 for U.S. Appl. No. 13/906,621, 11 pages.
Final Office Action mailed Aug. 11, 2015 for U.S. Appl. No. 13/829,737, 11 pages.
Non-Final Office Action mailed Jul. 31, 2015 for U.S. Appl. No. 14/706,359, 7 pages.
Non-Final Office Action mailed Sep. 3, 2015 for U.S. Appl. No. 13/906,621, 14 pages.
Final Office Action mailed Sep. 4, 2015 for U.S. Appl. No. 14/097,459, 10 pages.

* cited by examiner

DEVICES AND STACKED MICROELECTRONIC PACKAGES WITH PACKAGE SURFACE CONDUCTORS AND METHODS OF THEIR FABRICATION

TECHNICAL FIELD

Embodiments of the present disclosure relate generally to microelectronic packaging and, more particularly, to devices and stacked microelectronic packages having surface conductors and methods for the fabrication thereof.

BACKGROUND

It is often useful to combine multiple microelectronic devices, such as semiconductor die carrying integrated circuits (ICs), micro-electromechanical systems (MEMS), optical devices, passive electronic components, and the like, into a single package that is both compact and structurally robust. Packaging of microelectronic devices has traditionally been carried-out utilizing a so-called two dimensional (2D) or non-stacked approach in which two or more microelectronic devices are positioned and interconnected in a side-by-side or laterally adjacent spatial relationship. More particularly, in the case of ICs formed on semiconductor die, packaging has commonly entailed the mounting of multiple die to a package substrate and the formation of desired electrical connections through wire bonding or flip-chip connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, biomedical devices, and other compact electronic devices. Additionally, such 3D packaging techniques may enhance device performance by reducing interconnection length, and thus signal delay, between the packaged microelectronic devices.

BRIEF DESCRIPTION OF THE DRAWINGS

Embodiments of the present disclosure will hereinafter be described in conjunction with the following figures, wherein like numerals denote like elements, and.

Figure 1:
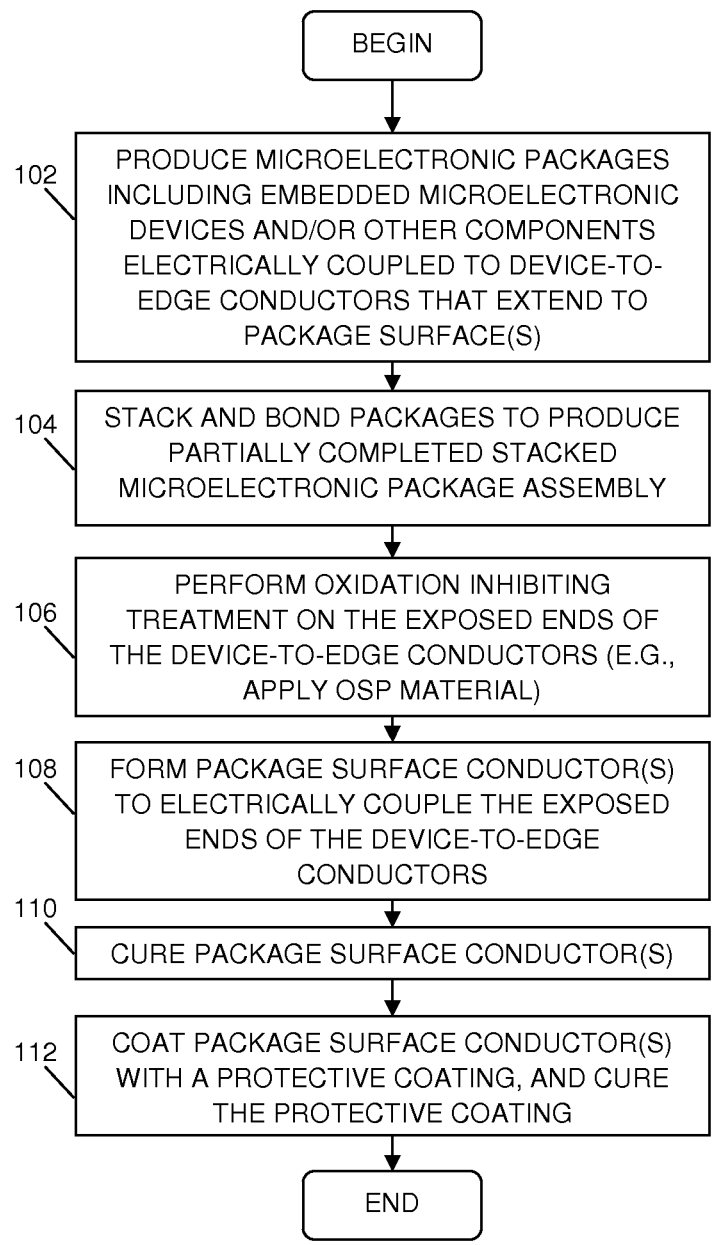
FIG. 1 is a flowchart of a method for fabricating a stacked microelectronic package assembly, according to an embodiment.

For simplicity and clarity of illustration, the drawing figures illustrate the general manner of construction and may omit depiction, descriptions, and details of well-known features and techniques to avoid unnecessarily obscuring the non-limiting embodiments of the disclosure described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the disclosure.

DETAILED DESCRIPTION

The following Detailed Description is merely illustrative in nature and is not intended to limit the disclosure or the application and uses of the disclosure. Any implementation described herein as is not necessarily to be construed as preferred or advantageous over other implementations. Furthermore, there is no intention to be bound by any theory presented in the preceding Background or the following Detailed Description.

As used herein, the term "microelectronic device" is utilized in a broad sense to refer to an electronic device, element, or component produced on a relatively small scale and amenable to packaging in the below-described manner. Microelectronic devices include, but are not limited to, integrated circuits (ICs) formed on semiconductor die, micro-electromechanical systems (MEMS), passive electronic components, optical devices, and other small scale electronic devices capable of providing processing, memory, sensing, radio frequency communication, radar, optical functionalities, and actuator functionalities, to list but a few examples. The term "microelectronic package" denotes a structure containing at least one and typically two or more microelectronic devices, which may or may not be electrically interconnected. A microelectronic package may include, for example, one or more microelectronic devices, packaging material (e.g., encapsulant) substantially surrounding the microelectronic devices, one or more patterned conductive layers and other conductive structures (e.g., vias and the like) that provide electrical connectivity with the microelectronic device(s), and one or more contacts for electrically coupling the microelectronic devices of the microelectronic package with external electrical systems. For example, a microelectronic package may be a "fan out wafer level" type of package, also referred to as a "redistributed chip package" (RCP). The term "stacked microelectronic package assembly" refers to an assembly containing at least two microelectronic packages stacked together and physically coupled. According to an embodiment, a bottom package in a stacked microelectronic package may include contact pads on its bottom surface (e.g., ball grid array pads), which enable the stacked microelectronic package to be electrically and physically connected to a printed circuit board (PCB) or other substrate. In addition, in still other embodiments, a top package in a stacked microelectronic package may include contact pads on its top surface, and one or more other devices may be surface mounted to the top surface of the top package.

As will be described in more detail below, an embodiment of a microelectronic package includes at least one "device-to-edge conductor," which is a conductive structure that extends between one or more embedded microelectronic devices or other electrical components and a surface of the microelectronic package (e.g., a sidewall, a top surface, a bottom surface, or a surface that ultimately is embedded within the microelectronic package). In some embodiments, electrical interconnections (referred to herein as "package sidewall conductors" or "package surface conductors") may be formed on a package surface between exposed ends of device-to-edge conductors of a single microelectronic package. Although most of the illustrated embodiments depict electrical interconnections formed on package sidewalls (e.g., package sidewall conductors), it should be understood that the description and the various embodiments may apply equally to conductors that are formed on other package surfaces, as well. Therefore, each of the below described embodiments extend to embodiments implemented on package sidewalls and other package surfaces. In other embodiments, multiple microelectronic packages with device-to-edge conductors may be stacked together to form a stacked microelectronic package assembly, and package surface conductors may be formed between exposed ends of device-to-edge conductors of different microelectronic packages of the stacked microelectronic package assembly. The "exposed end" of a device-to-edge conductor may be referred to herein as a "pad."

A device that includes a single microelectronic package or multiple microelectronic packages in a stacked arrangement may be considered to include a "package body," and one or more device-to-edge conductors may extend to the sidewalls and/or other surfaces of the package body. As used herein, the term "package body" may mean the structural package components of a single microelectronic package or the structural package components of multiple microelectronic packages in a stacked arrangement, where the "structural package components" are those portions of the device that define the shape of the device and hold the electrical components in a fixed orientation with each other.

The following describes embodiments of package surface conductors formed on one or more surfaces of a microelectronic package, microelectronic devices that include such package surface conductors, stacked microelectronic package assemblies, and methods of their formation. As will be apparent from the below description, the package surface conductors can be utilized to provide a convenient manner in which microelectronic devices contained within one or more microelectronic packages can be electrically coupled.

FIG. 1 is a flowchart of an embodiment of a method for fabricating a stacked microelectronic package assembly, according to an embodiment. The completed microelectronic package assembly produced pursuant to the below-described method may also be referred to as a Package-on-Package (PoP) device or a System-in-Package (SiP) device, depending upon the particular manner in which the completed microelectronic package assembly is implemented. Although a result of the performance of the method of FIG. 1 is a microelectronic package assembly that includes multiple, stacked microelectronic packages, it should be understood that embodiments of the inventive subject matter may be utilized with a single microelectronic package, as well.

As shown in FIG. 1 and described in detail below, the method is offered by way of non-limiting example only. It is emphasized that the fabrication steps shown in FIG. 1 can be performed in alternative orders, that certain steps may be omitted, and that additional steps may be performed in further embodiments. Furthermore, various steps in the manufacture of a stacked microelectronic package assembly or certain components included within a stacked microelectronic package assembly are well-known and, in the interests of brevity, will only be mentioned briefly herein or will be omitted entirely without providing the well-known process details. It will be appreciated that method can be utilized to produce various other types of stacked microelectronic package assemblies having configurations that are different from those included in the Figures.

Referring to FIG. 1, the method begins with the production of a number of microelectronic packages in process 102. More particularly, as will be described in detail below, process 102 results in the production of a number of microelectronic packages that include embedded microelectronic devices and/or other components that are electrically coupled to device-to-edge conductors that extend to one or more package surfaces. Any method suitable for fabricating a stackable package or microelectronic package having at least one electrically-conductive element exposed through a package sidewall and electrically coupled to a microelectronic device contained within the microelectronic package can be carried-out during process 102. Embodiments of the inventive subject matter may be implemented in various types of microelectronic packages that can be fabricated to include device-to-edge conductors that extend to one or more surfaces of the package, including but not limited to substrate based wirebond packages, flip chip packages, and redistributed chip packages (RCP), for example. Although embodiments illustrated in the figures and discussed below pertain to RCP types of packages, it is to be understood that the inventive subject matter is not limited to application only in RCP types of packages.

Figure 2:
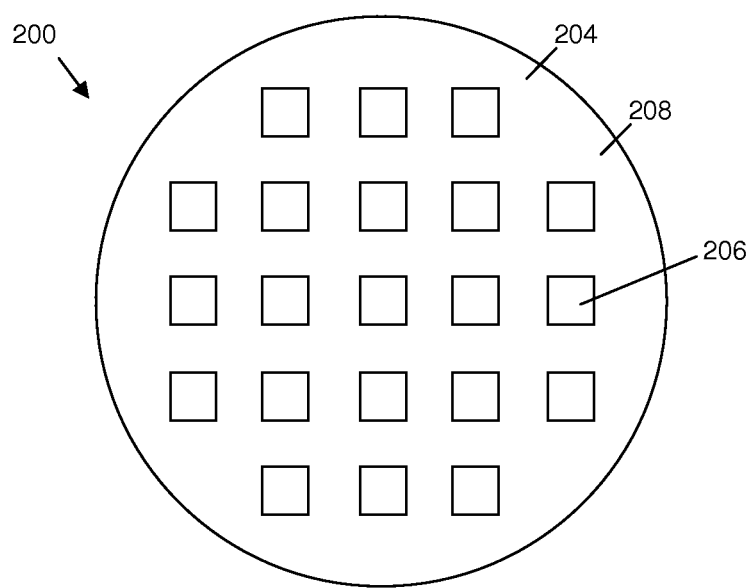
FIG. 2 is a top-down view illustrating a partially-completed microelectronic device panel, according to an embodiment.

FIGS. 2-5 illustrate various stages in the production of an embodiment of a microelectronic package. More specifically, FIG. 2 is a top-down view illustrating a partially-completed microelectronic device panel 200, which corresponds to a first stage of production of an embodiment of a microelectronic package (e.g., a first stage of production carried out in conjunction with process 102, FIG. 1). According to an embodiment, microelectronic device panel 200 may be produced utilizing an RCP process or another chips-first packaging technique. More specifically, microelectronic device panel 200 includes a panel body 208 in which a plurality of microelectronic devices 206 are embedded. Microelectronic devices 206 may be substantially identical or may instead vary in type, function, size, and so on. For example, some of devices 206 may be devices of a first type (e.g., an application specific integrated circuit (ASIC) die, a microprocessor, or another type of device), while others of devices 206 may be devices of a second type (e.g., a MEMS device or another type of device). According to an embodiment, devices 206 have contact bearing surfaces that are exposed through major surface 204 of panel body 208 (referred to herein as "panel surface 204"). In the illustrated example, device panel 200 includes twenty one square-shaped devices 206 arranged in a grid pattern or array. However, the number of microelectronic devices, the planform dimensions of the microelectronic devices (e.g., the die shape and size), and the manner in which the devices are spatially distributed within panel body 208 may vary amongst embodiments. Panel body 208 is typically produced as a relatively thin, disc-shaped body or mass having a generally circular planform geometry. However, panel body 208 can be fabricated to have any desired shape and dimensions. In various embodiments, panel body 208 can have a thickness that is less than, equivalent to, or slightly exceeding the original height of microelectronic devices 206 to minimize the overall vertical profile of the completed stacked microelectronic package assembly.

According to an embodiment, microelectronic device panel 200 may be produced as follows. First, microelectronic devices 206 are positioned in a desired spatial arrangement over the surface of a support substrate or carrier (not shown), with their contact bearing surfaces in contact with the carrier. For example, devices 206 may be arranged over the carrier in a grid array of the type shown in FIG. 2. If desired, one or more release layers may also be applied or formed over the carrier's upper surface prior to positioning of microelectronic devices 206. A mold frame with a central cavity or opening therethrough may be positioned over the carrier and around the array of microelectronic devices 206. An encapsulant, such as a silica-filled epoxy, may then be dispensed into the cavity of the mold frame and allowed to flow over microelectronic devices 206. Sufficient volume of the encapsulant may be dispensed over microelectronic devices 206 to enable the encapsulant to flow over the uppermost or non-contact-bearing surfaces of the microelectronic devices 206. The encapsulant may then be solidified by, for example, an oven cure to yield a solid panel body 208 in which microelectronic devices 206 are embedded. Panel body 208 may be rigid or flexible, depending upon the chosen encapsulant. Panel body 208 may then be released from the carrier to reveal the backside of body 208 through which the contact-bearing surfaces of microelectronic devices 206 are exposed (e.g., panel surface 204 in the embodiment shown in FIG. 2). If desired, the front side of panel body 208 may be ground or polished to bring device panel 200 to a desired thickness prior to release of the panel body from the carrier. The foregoing example notwithstanding, panel body 208 can be produced utilizing various other known fabrication techniques including, for example, compression molding and lamination processes.

After encapsulation of microelectronic devices 206 within panel body 208, a plurality of device-to-edge conductors may be fabricated over panel surface 204 of microelectronic device panel 200. In other embodiments, device-to-edge conductors may be formed entirely or partially at or below the panel surface (e.g., portions of the device-to-edge conductors may be embedded within or at the surface of the encapsulant or package). The term "device-to-edge conductor," as used herein, refers to an electrically-conductive structure or element, such as a metal trace, a wire, an interconnect line, a metal-filled trench, a bond pad, a combination thereof, or the like. Each device-to-edge conductor is electrically coupled to an electrical component that is embedded in a microelectronic package and/or that has at a connection point (to the device-to-edge conductor) that is not co-located with the package surface on which surface conductors are to be formed (e.g., a microelectronic device or other electrical component embedded within a microelectronic package, a bond pad on a bottom surface of the device, and so on). In addition, each device-to-edge conductor extends to a sidewall or other surface of the package to contact a package surface conductor, such as the sidewall conductors described below in conjunction with FIGS. 10-13. The device-to-edge conductors can assume a wide variety of different forms. In some embodiments, a device-to-edge conductor may consist of or include a combination of one or more electrically-conductive lines (e.g., metal traces), vias, metal plugs, leadframes, and/or other conductive features, which are formed on, between, and/or through one or more dielectric layers. The conductive lines may be included within one or more layers that may be referred to as "build-up layers," "metal layers," or "redistribution layers" (RDLs). Collectively, the conductive features provide an electrically conductive path between an encapsulated microelectronic device 206 and a package surface conductor to be formed later on the package sidewall, as described below in conjunction with FIGS. 10-13.

Figure 3:
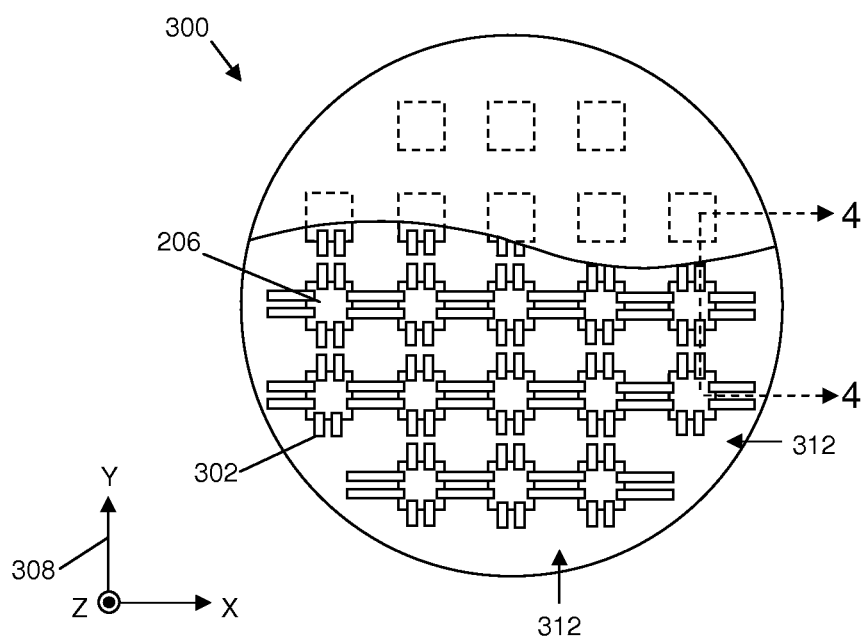
FIG. 3 illustrates a top-down view illustrating the partially-completed microelectronic device panel of FIG. 2 at a later stage of production, according to an embodiment.
Figure 4:
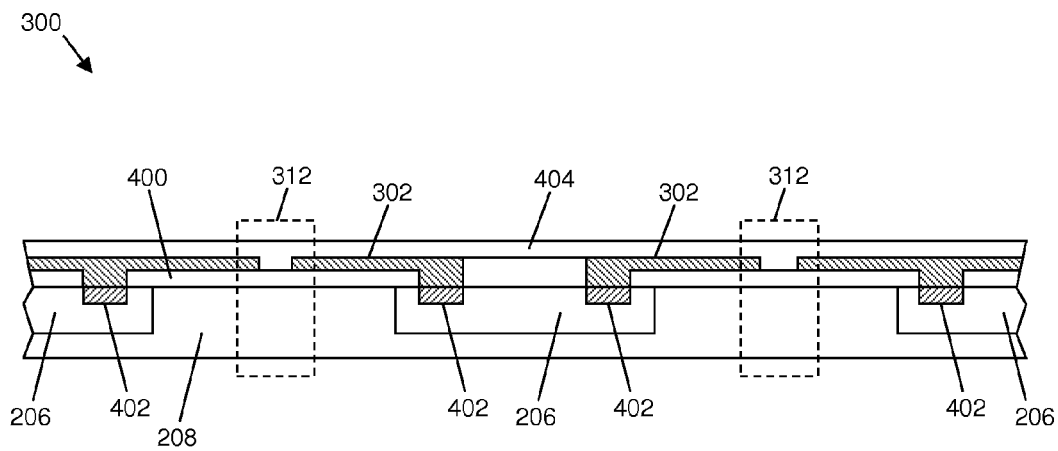
FIG. 4 is a cross-sectional view of a portion of the microelectronic device panel of FIG. 3, according to an embodiment.

FIG. 3 illustrates a top-down view of a partially-completed microelectronic device panel 300 at a later stage of production of an embodiment of a microelectronic package (e.g., a next stage of production carried out in conjunction with process 102, FIG. 1), and FIG. 4 is a cross-sectional view of a portion of the microelectronic device panel 300 of FIG. 3 along line 4-4, according to an embodiment. In FIG. 3, microelectronic device panel 300 represents a partially cut-away version of device panel 200 after one or more build-up layers (including device-to-edge conductors 302) have been formed over device surface 204 (FIG. 2). The cut-away portion of FIG. 3 shows a number of device-to-edge conductors 302 that can be included in one or more build-up layers over device surface 204 during production of microelectronic device panel 300. As shown in FIGS. 3 and 4, device-to-edge conductors 302 may include a number of interconnect lines or metal (e.g., copper) traces. The trace portions of the device-to-edge conductors 302 may extend along a plane parallel with device surface 204 or, stated differently, along the x-y plane identified in FIG. 3 by coordinate legend 308. Device-to-edge conductors 302 can be produced using bumping or wafer level packaging fabrication techniques such as sputtering, plating, jetting, photolithography, and/or stencil printing (e.g., of an electrically-conductive ink), to list but a few examples. Device-to-edge conductors 302 may be formed on or between one or more layers of dielectric material, such as layer 400, for example.

As may be appreciated most readily with reference to FIG. 4, device-to-edge conductors 302 are electrically coupled to a number of landing pads or other electrical contact points 402 provided on each microelectronic device 206. Device-to-edge conductors 302 may be electrically connected to device contact points 402 by filled vias, plated vias, metal plugs, or the like formed through the dielectric layer 400 or layers underlying the trace portions of device-to-edge conductors 302. After formation of device-to-edge conductors 302, one or more overlying dielectric, capping, or passivation layers 404 may be formed over device-to-edge conductors 302 utilizing a spin-on coating process, printing, lamination, or another deposition technique. According to an embodiment, the outermost dielectric layer 404 (i.e., the dielectric layer overlying device-to-edge connectors 302) has a thickness sufficient to ensure that the ends of device-to-edge connectors 302 will not lift and crack the outermost dielectric layer 404 during device singulation. For this reason, the outermost dielectric layer 404 may be referred to herein as a "trace anchoring layer." According to an embodiment, the trace anchoring layer 404 may have a thickness in a range of about 20 microns to about 30 microns, although the trace anchoring layer 404 may be thicker or thinner, as well.

According to an embodiment, device-to-edge conductors 302 extend from their respective microelectronic devices 206 to neighboring dicing streets 312, which surround or border each device 206. Dicing streets 312 represent portions of device panel 300 located between and around devices 206. According to an embodiment, dicing streets 312 do not include electrically-active elements, and the material within the dicing streets 312 is removed during singulation to yield individual microelectronic packages. Dicing streets 312 are also commonly referred to as "saw streets". However, the term "dicing streets" is used herein to emphasize that, while singulation can be accomplished through a mechanical sawing process, other dicing techniques can be employed to separate the microelectronic packages during singulation including, for example, laser cutting and scribing with punching. As shown in the embodiment illustrated in FIGS. 3 and 4, neighboring device-to-edge conductors 302, which extend along aligning axes (e.g., x- and/or y-axes of coordinate system 308), can be formed to connect or meet within dicing streets 312 and thereby form a continuous conductive line extending between neighboring microelectronic devices 206, as is the case for device-to-edge conductors 302 that are aligned in parallel with the x-axis in FIG. 3. However, the portions of device-to-edge conductors 302 extending into dicing streets 312 alternatively may not be continuous between neighboring microelectronic devices 206, as is the case for device-to-edge conductors 302 that are aligned in parallel with the y-axis in FIG. 3.

While a single layer or level of device-to-edge conductors 302 are shown to be included in microelectronic panel 300 in the example embodiment shown in FIGS. 3 and 4, multiple layers or levels of device-to-edge conductors 302 can be included within a microelectronic panel, and/or layers of device-to-edge conductors may be present proximate to other surfaces of a microelectronic panel, in other embodiments. For example, the microelectronic package 610 shown in FIG. 6 includes three layers of device-to-edge conductors 622, 624, 628, where two layers 620 are proximate one surface 612 of the microelectronic package 610 and one layer 626 is proximate another surface 614 of the microelectronic package 610. Furthermore, in embodiments in which one or more of the individual microelectronic packages include multiple embedded microelectronic devices, additional conductors may also be formed at this juncture in the fabrication process in conjunction with the formation of device-to-edge conductors 302, where those additional conductors may serve to interconnect the multiple devices included within each microelectronic package.

Figure 5:
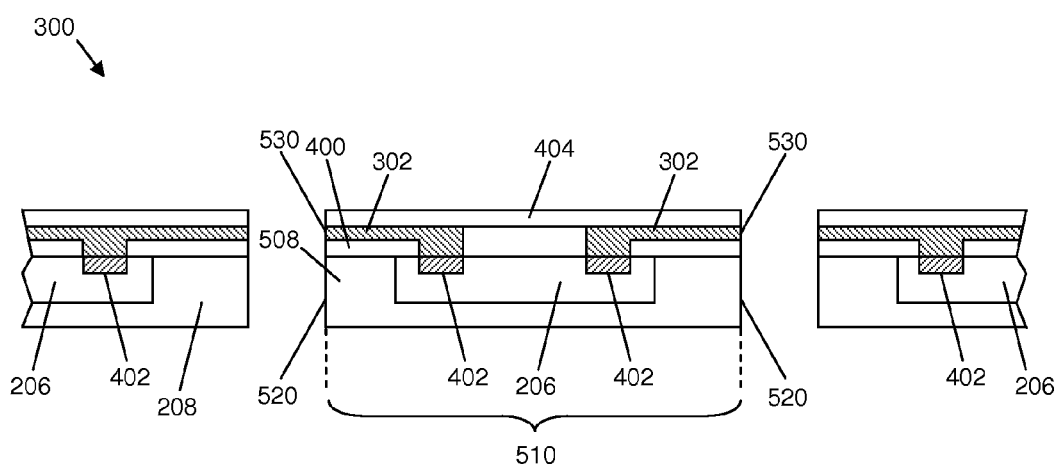
FIG. 5 illustrates a cross-sectional view of the portion of the microelectronic device panel of FIG. 4 after singulation of the panel into a plurality of first microelectronic packages, according to an embodiment.
Figure 12:
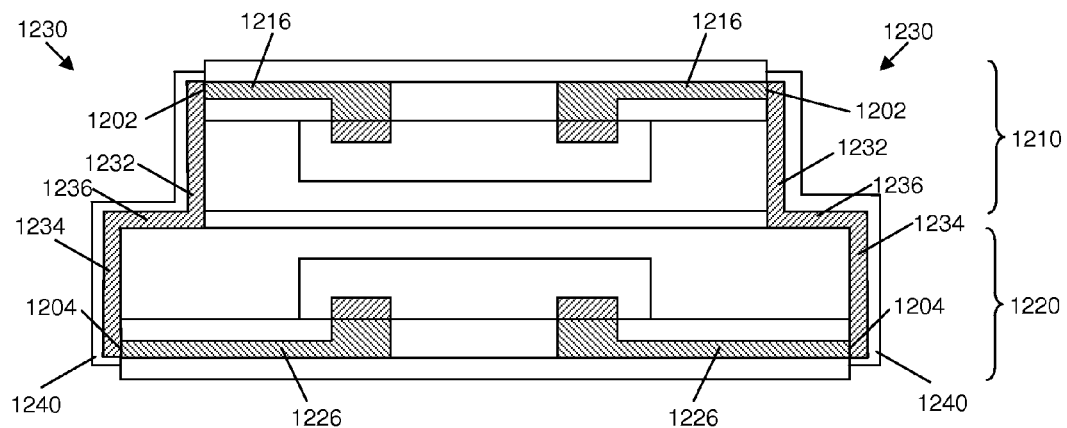
FIG. 12 illustrates a cross-sectional, side view of a completed stacked microelectronic package assembly, according to another embodiment.
Figure 13:
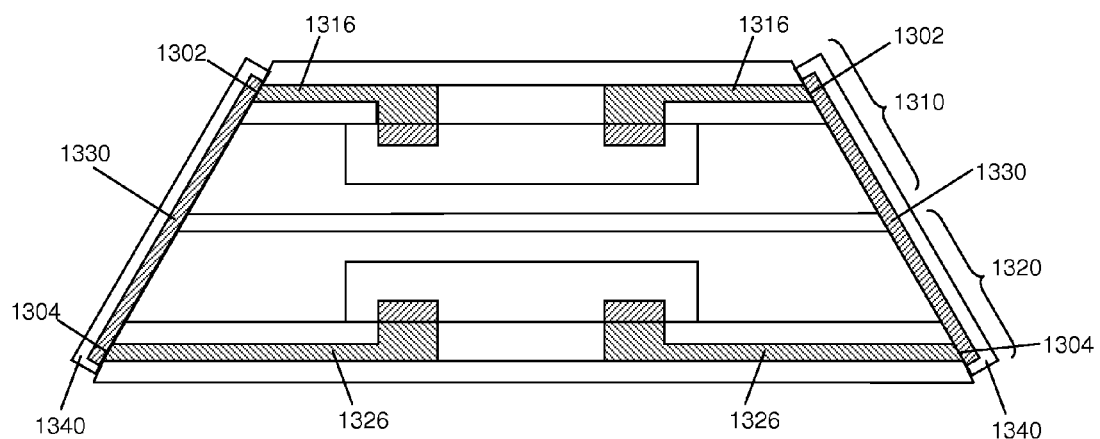
FIG. 13 illustrates a cross-sectional, side view of a completed stacked microelectronic package assembly, according to yet another embodiment.

Referring again to FIG. 5, microelectronic device panel 300 is singulated to complete production of the microelectronic packages during process 102 of method 100 (FIG. 1). More particularly, singulation produces a microelectronic package 510 that includes one or more microelectronic devices 206 embedded in a microelectronic package body 508, and a plurality of device-to-edge conductors 302 (e.g., including metal traces) extending from electrical contact points 402 of the device(s) 206 to the package sidewalls 520. As previously indicated, panel singulation can be carried-out by mechanical sawing. However, any suitable separation process can be utilized, including laser cutting and scribing with punching. In one embodiment, singulation is performed utilizing a conventional dicing saw, such as a water-cooled diamond saw. FIG. 5 illustrates, in cross-sectional view, a portion of microelectronic device panel 300 after singulation to yield a plurality of microelectronic packages 510 (only one of which is fully shown and identified in FIG. 5). According to an embodiment, each microelectronic package 510 is cut to have a substantially rectangular shape and to include four package edges or sidewalls 520 that are substantially orthogonal with respect to the package top and bottom surfaces. In another embodiment, singulated microelectronic packages may have package sidewalls that are not orthogonal to the top and bottom surfaces of the package (e.g., as depicted in the embodiment of FIGS. 12 and 13, described later).

Either way, as device-to-edge conductors 302 were previously formed to extend into dicing streets 312 (now removed), distal ends 530 of the device-to-edge conductors 302 extend to and are exposed at the sidewalls 520 of the singulated microelectronic packages 510. The ends of the device-to-edge conductors 302 also are referred to herein as "sidewall pads" or "package surface pads" herein. In various embodiments, a microelectronic package 510 may be configured so that device-to-edge conductors 302 extend to each of the four package sidewalls 520. However, in other embodiments, a microelectronic package may be configured so that device-to-edge conductors 302 extend to fewer than all of the package sidewalls (e.g., to one, two, or three sidewalls) and/or to other package surfaces. Some methods of singulation may alter the physical dimensions of the distal ends 530 of the device-to-edge conductors 302 with respect to portions of the device-to-edge conductors 302 that are embedded further within the microelectronic package 510. For example, when a mechanical sawing process is used to singulate the microelectronic packages 510, conductive material at the distal ends 530 of the device-to-edge conductors 302 may be smeared or flare slightly, thus providing a larger area to which the subsequently formed package surface conductors (e.g., package surface conductors 1010-1012, FIG. 10) may be connected.

Figure 6:
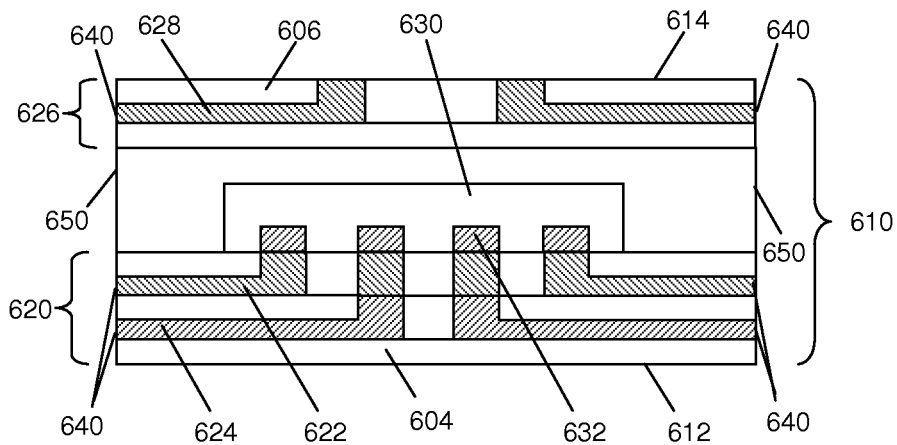
FIG. 6 illustrates a cross-sectional view of a second microelectronic package, according to an embodiment.

FIG. 6, which was referred to briefly above, illustrates a cross-sectional view of a microelectronic package 610 in accordance with another embodiment. The microelectronic package 610 may be fabricated using techniques similar to those described above with respect to the first microelectronic package 510, except that additional processing steps may be carried out to form more than one layer of device-to-edge conductors prior to singulation of microelectronic package 610 from a microelectronic device panel within which it is initially formed. More specifically, microelectronic package 610 includes two layers 620 of device-to-edge conductors 622, 624 below a bottom surface of a microelectronic device 630 embedded within the microelectronic package 610 (or proximate a bottom surface 612 of the microelectronic package 610), where the bottom layers 620 of device-to-edge conductors 622, 624 are coupled to electrical contact points 632 of the microelectronic device 630, and an additional layer 626 of device-to-edge conductors 628 above a top surface of the microelectronic device 630 (or proximate a top surface 614 of the microelectronic package 610). Distal ends 640 of the device-to-edge conductors 622, 624, 628 extend to and are exposed at the sidewalls 650 of the singulated microelectronic package 610. In addition, as with microelectronic package 510, outermost dielectric layers 604, 606 (i.e., the "trace anchoring layers" overlying device-to-edge connectors 624, 628) have thicknesses sufficient to ensure that the ends of device-to-edge connectors 624, 628 did not lift and crack the outermost dielectric layers 604, 606 during device singulation (e.g., thicknesses in a range of about 20 microns to about 30 microns, although the trace anchoring layers 604, 606 may be thicker or thinner, as well).

As will be described in more detail below, although the layer 626 of device-to-edge conductors 628 proximate the top surface 614 of the microelectronic package 610 are not electrically coupled to a microelectronic device within the microelectronic package 610, the device-to-edge conductors 628 ultimately may be coupled to another microelectronic device (e.g., microelectronic device 710, FIG. 7). Thus, the terminology "device-to-edge" conductors still applies. In some embodiments, however, some or all conductors within a layer of device-to-edge conductors may not be directly coupled to a microelectronic device in a final assembly, but instead may provide routing to which other layers of device-to-edge conductors are directly coupled. For example, a microelectronic package assembly may include a "device-to-edge conductor" that merely provides routing from one package surface to another package surface (or even between spatially separated points on the same package surface. Although such conductors may not be directly coupled to a microelectronic device, they are still referred to as device-to-edge conductors herein, and that term is intended to include such conductors. Further, although microelectronic packages 510, 610 depict particular numbers of layers of device-to-edge conductors, those of skill in the art would understand, based on the description herein, that a microelectronic package may have any practical number of layers of device-to-edge conductors proximate top, bottom, and/or other surfaces of the microelectronic package.

Referring again to FIG. 1, in process 104, a singulated microelectronic package (e.g., microelectronic package 510 produced during process 102) may be combined with (e.g., stacked and bonded with) one or more additional microelectronic packages (e.g., microelectronic packages 610, 710) to produce a partially-completed stacked microelectronic package assembly 800. For example, FIGS. 7-8 include an exploded cross-sectional view and a cross-sectional view, respectively, depicting a manner which a first microelectronic package 510 may be positioned in stacked relationship with second and third microelectronic packages 610, 710 to produce a partially-completed stacked microelectronic package assembly 800 with sidewalls 520, 650 of two of the packages 510, 610 substantially aligned in a co-planar manner, according to an embodiment. Any suitable number of additional device layers may also be included within a partially-completed stacked microelectronic package assembly 800.

In view of the illustrated orientation of the stacked microelectronic package assembly of FIGS. 7 and 8, microelectronic package 510 will be referred to below as "lower microelectronic package 510", microelectronic package 610 will be referred to as "middle microelectronic package 610," and microelectronic package 710 will be referred to as "upper microelectronic package 710." It should be understood, however, that this terminology is used for convenience of reference only, that the orientation of the completed stacked microelectronic package assembly is arbitrary, and that the microelectronic package assembly may be inverted during later processing steps and/or when incorporated into a larger electronic system or device.

Microelectronic packages 510, 610, 710 (and any additional microelectronic device packages included within the partially-completed stacked microelectronic package assembly 800) may be laminated or otherwise coupled together during process 104 of method 100. As indicated in FIGS. 7 and 8, this may be accomplished in some cases by applying or otherwise positioning an intervening bonding layer 730 between microelectronic packages 510, 610 prior to package stacking. Bonding layer 730 can be an epoxy or other adhesive, which may be applied over the upper surface of lower microelectronic package 510 and thermally cured after positioning of upper microelectronic package 610, for example. This example notwithstanding, any suitable bonding material or means can be utilized to bond microelectronic packages 510, 610 together including, for example, double-sided adhesive tape, dispensed adhesive, soldering, gluing, brazing, clamping, and so on. By coupling microelectronic packages 510, 610 together in this manner, the relative positioning of microelectronic packages 510, 610 and, therefore, the relative positioning of the microelectronic devices 206 and 630 embedded within microelectronic packages 510, 610 can be maintained during further processing.

In other cases, microelectronic packages (e.g., microelectronic packages 610, 710) may be coupled together using solder or other electrical connection means (e.g., wirebonds or other structures). For example, electrical contact points 712 of microelectronic package 710 may be aligned with and brought into contact with portions of device-to-edge conductors 628 exposed at the top surface 614 of microelectronic package 610, and the electrical contact points 712 and the device-to-edge conductors 628 may be physically and electrically connected together with solder (not shown), in an embodiment. Microelectronic packages 510, 610, 710, and any other microelectronic packages to be included within the stacked microelectronic package assembly can be tested prior to stacking to ensure that only known-good microelectronic packages are consolidated during process 104.

Figure 7:
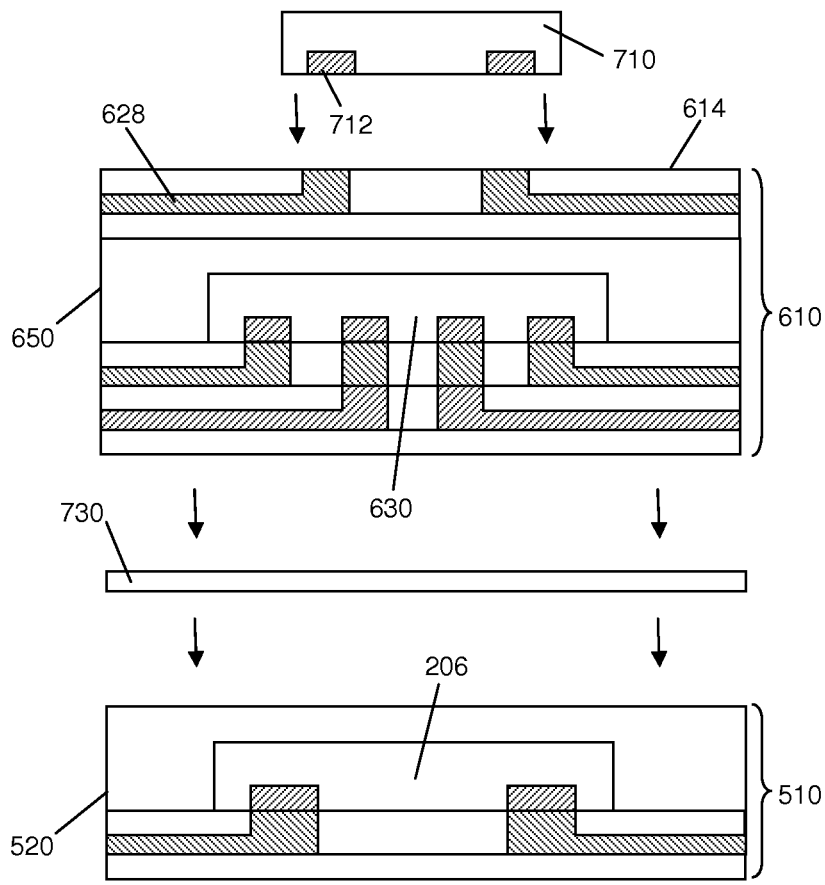
FIGS. 7-8 are exploded cross-sectional and cross-sectional views, respectively, depicting a manner which a first microelectronic package may be positioned in stacked relationship with second and third microelectronic packages to produce a partially-completed stacked microelectronic package assembly, according to an embodiment.
Figure 8:
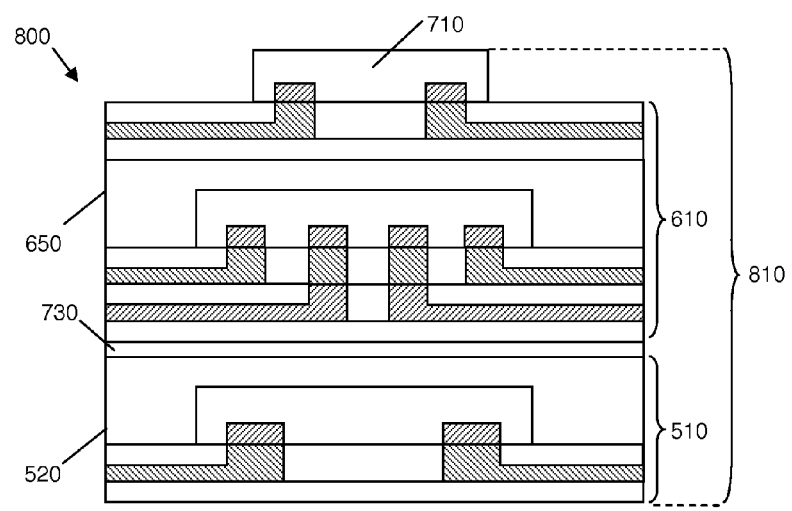

In the embodiment illustrated in FIGS. 7 and 8, microelectronic package 510 is positioned in a stacked relationship with microelectronic package 610 after both packages 510, 610 have been singulated from a device panel (e.g., panel 300, FIG. 3). However, in other embodiments, microelectronic package 510 may be positioned in a stacked relationship with microelectronic package 610 prior to singulation of microelectronic package 610 from its corresponding device panel, or vice versa. In other words, multiple instances of singulated microelectronic package 510 may be stacked on and bonded to non-singulated instances of microelectronic packages 610, or vice versa. After bonding the singulated packages 510 to the non-singulated packages 610 of the device panel (e.g., in the above-described manner), the individual stacked microelectronic package assemblies may then be separated by singulation of the panel that includes microelectronic device packages 610. In still another alternate embodiments, the wafers that include both microelectronic devices 510, 612 may be stacked and bonded together prior to singulation. In either embodiment, microelectronic packages 710 may be connected to microelectronic package 610 prior to or after singulation. These alternative fabrication techniques likewise yield a plurality of partially-completed stacked microelectronic package assemblies, such as the stacked microelectronic package assembly 800 shown in FIG. 8. In still further embodiments, any number of device panels may be stacked, bonded, and then singulated to produce a plurality of partially-completed stacked microelectronic package assemblies during process 104. In any event, a composite package body 810 is formed from the combination of microelectronic packages 510, 610, 710, in the embodiment illustrated in FIG. 8.

Although the example shown in FIG. 8 depicts a top surface of microelectronic package 510 bonded to a top surface of microelectronic package 610, a bottom surface of microelectronic package 510 may be bonded to the bottom surface of microelectronic package 610, or, if microelectronic package 710 were excluded, the bottom surface of microelectronic package 510 may be bonded to the top surface of microelectronic package 610, or the top surface of microelectronic package 510 may be bonded to the top surface of microelectronic package 610. The foregoing processes are all considered to constitute the stacking of microelectronic device packages, whether stacking is performed utilizing multiple singulated packages, multiple non-singulated packages in the form of multiple device panels, or a combination of singulated packages and one or more device panels. Manufacturing techniques in which package stacking is performed on a partial or full panel level can facilitate the positioning and bonding of the stacked microelectronic package assemblies, thereby potentially improving throughput while reducing manufacturing time and cost.

Referring again to FIG. 1, in process 106, the exposed distal ends 530, 640 of the device-to-edge conductors 302, 622, 624, 628 are treated in a manner that will increase the quality and robustness of later formed (e.g., in block 108) connections between the distal ends 530, 640 and package surface conductors (e.g., package surface conductors 1010-1012, FIG. 10), in an embodiment. More specifically, the treatment is configured to prevent oxidation of the conductive material (e.g., copper) from which the device-to-edge conductors 302, 622, 624, 628 are formed, or more specifically to prevent oxidation of the exposed distal ends 530, 640 of the device-to-edge conductors 302, 622, 624, 628. In a particular embodiment, a material that inhibits oxidation (referred to herein as an "oxidation inhibiting material") is applied to the distal ends 530, 640 of the device-to-edge conductors 302, 622, 624, 628. Essentially, the oxidation inhibiting material results in a significantly reduced resistance at the interface between the distal ends 530, 640 of the device-to-edge conductors 302, 622, 624, 628 and the subsequently formed package surface conductors (e.g., package surface conductors 1010-1012, FIG. 10) when compared with a resistance that would be present if the oxidation inhibiting treatment were not performed.

For example, the oxidation inhibiting material may include an organic solderability protectant (OSP) coating or another material (e.g., benzotriazole, tolytriazole, benzimidazole, phenylimidazole, or other materials) that adheres to the exposed distal ends 530, 640, and prevents the conductive material at the exposed distal ends 530, 640 from oxidizing. In alternate embodiments, the oxidation inhibiting material may include one or more conductive plating materials (e.g., plating materials that include gold, nickel, silver, tin, palladium, lead, and/or other materials, including but not limited to ENIG (electroless nickel immersion gold), electrolytic gold (NiAu), ENEPIG (electroless nickel electroless palladium immersion gold), HAL/HASL (hot air leveling/hot air solder leveling) Sn/Pb or Pb-free solder, immersion tin, immersion silver, and/or other plating materials) that are applied using an electroplating or electroless plating method. Other materials that inhibit oxidation of the distal ends 530, 640 also could be used, in still other embodiments. Whichever oxidation inhibiting material is selected, the oxidation inhibiting material should be a material that is not electrically insulating and/or that allows sufficient electron tunneling to occur between the device-to-edge conductors 302, 622, 624, 628 and the subsequently formed package surface conductors (e.g., package surface conductors 1010-1012, FIG. 10).

Figure 9:
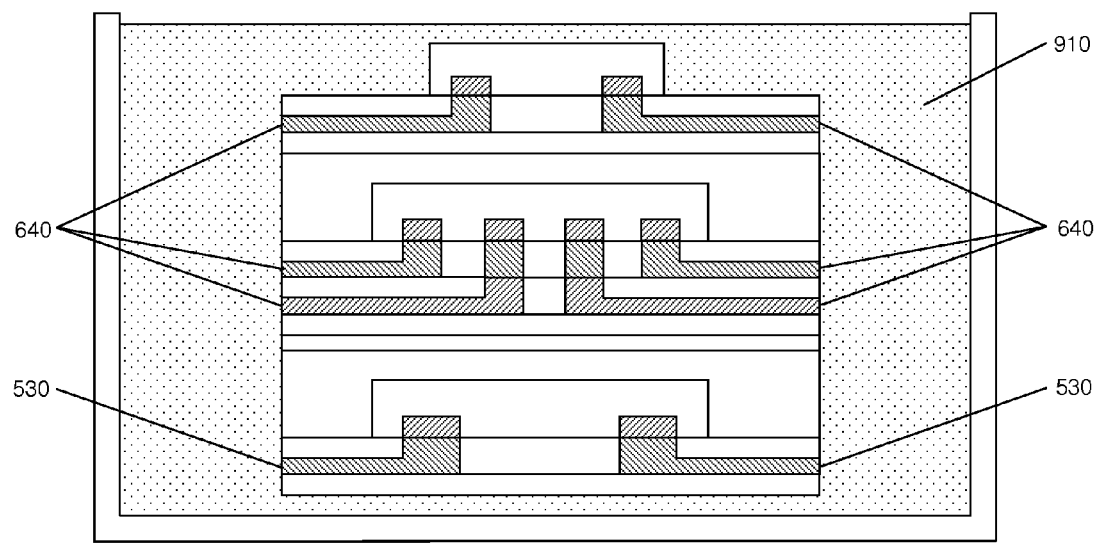
FIG. 9 illustrates a side view of the partially-completed, stacked microelectronic package assembly of FIG. 8 immersed in a bath that contains a solubility protectant coating, according to an embodiment.

In various embodiments, the oxidation inhibiting material may be applied to the exposed distal ends 530, 640 by printing, plating (e.g., electroplating or electroless plating), brushing, or otherwise applying the oxidation inhibiting material directly to the exposed distal ends 530, 640. In another embodiment, the oxidation inhibiting material may be applied to the exposed distal ends 530, 640 by immersing the stacked microelectronic package assembly 800 in a bath that includes the oxidation inhibiting material. For example, FIG. 9 illustrates a side view of the partially-completed, stacked microelectronic package assembly 800 of FIG. 8 immersed in a bath 910 that includes an oxidation inhibiting material (e.g., an OSP coating material or another type of oxidation inhibiting material), according to an embodiment. After immersion in the bath 910 for a period of time (e.g., about 1.0 minutes, more or less) that is sufficient for a desired quantity (e.g., one or more monolayers of material having a cumulative thickness in a range of about 100 nanometers (nm) to about 300 nm, more or less) of the oxidation inhibiting material to adhere to the exposed distal ends 530, 640, the microelectronic package assembly 800 may be removed from the bath 910, and residual material from the bath 910 may be removed from the portions of the microelectronic package assembly 800 on which the oxidation inhibiting material is not needed or desired. Depending on the type of oxidation inhibiting material used during process 106, the oxidation inhibiting material may be present in the final microelectronic package (e.g., especially in the case of plating the oxidation inhibiting material), or the oxidation inhibiting material may be destroyed during subsequent processing, and may not be present in the final microelectronic package.

Figure 10:
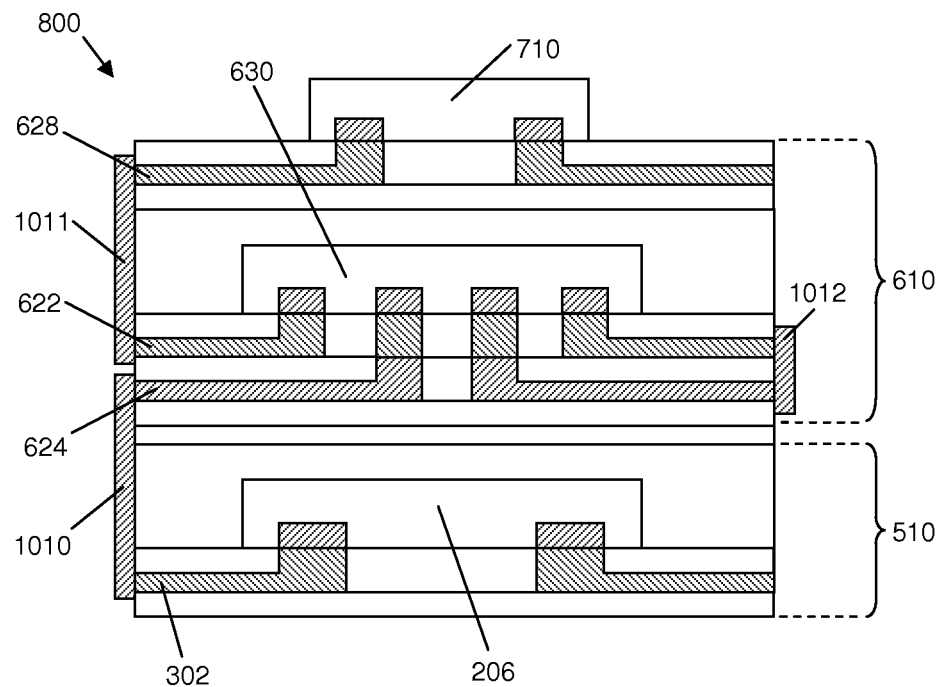
FIG. 10 illustrates a cross-sectional, side view of the partially-completed, stacked microelectronic package assembly of FIG. 8 after formation of package surface conductors, according to an embodiment.

Referring again to FIG. 1, in processes 108 and 110, package surface conductors (e.g., package surface conductors 1010-1012, FIG. 10) are then formed between the treated, exposed, distal ends 530, 640 of various combinations of device-to-edge conductors 302, 622, 624, 628. For example, FIG. 10 illustrates a cross-sectional, side view of the partially-completed, stacked microelectronic package assembly 800 of FIG. 8 after formation of package surface conductors 1010, 1011, 1012.

According to an embodiment, the package surface conductors 1010-1012 are formed by first depositing, in process 108, conductive material on the package sidewalls 520, 650 (and/or other surfaces) to electrically couple various combinations of the exposed ends 530, 640 of the device-to-edge conductors 302, 622, 624, 628. According to an embodiment, the ends of each package surface conductor 1010-1012 extend beyond the device-to-edge conductors 302, 622, 624, 628 which they interconnect, so that each package surface conductor 1010-1012 may anchor itself to the package surface beyond each device-to-edge conductor 302, 622, 624, 628. For example, each package surface conductor 1010-1012 may extend beyond the device-to-edge conductors 302, 622, 624, 628 by a distance between about 5.0 microns and about 20.0 microns. In other embodiments, the package surface conductors 1010-1012 may not extend beyond the device-to-edge conductors 302, 622, 624, 628 or they may extend beyond the device-to-edge conductors 302, 622, 624, 628 by distances less than or greater than the above given range.

The package surface conductors 1010-1012 may be deposited, for example, by coating, spraying, dispensing, evaporating, sputtering, jetting (e.g., inkjet and/or aerosol jet printing), stencil printing, needle dispense, or otherwise depositing the conductive material on the surfaces of the microelectronic package assembly 800. For some types of dispensing methods, the conductive material may be dispensed using multiple deposition passes, where each pass may successively increase the height of the conductive material forming the package surface conductor 1010-1012. According to an embodiment, the conductive material forming the package surface conductors 1010-1012 may include an electrically-conductive adhesive (ECA). In other embodiments, other suitable conductive materials may be used, including but not limited to conductive polymers and conducting polymers (e.g., polymers filled with conductive particles and/or nanoparticles such as metals (e.g., silver, nickel, copper, gold, and so on), alloys of metals, metal coated organic particles, metal coated ceramic particles), solder pastes, solder-filled adhesives, particle- and nanoparticle-filled inks, liquid metals (e.g., gallium indium (GaIn) and other liquid metals), and metal-containing adhesives or epoxies, such as silver-, nickel-, and copper-filled epoxies (collectively referred to herein as "electrically-conductive pastes"). Suitable conductive materials also include low melting point metals and alloys lacking resins or fluxes (e.g., metals and alloys having melting points below 300° C.). Such materials include, but are not limited to, indium and bismuth. According to an embodiment, the package surface conductors 1010-1012 may have thicknesses in a range of about 6 microns to about 10 microns, although the package surface conductors 1010-1012 may be thicker or thinner, as well.

The dispensing process may result in the presence of conductive material on the surfaces of the sidewalls 520, 650 between the package surface conductors 1010-1012. This excess conductive material, which alternatively may be referred to as "overspray," may result in undesired electrical conductivity (or shorts) between adjacent package surface conductors 1010-1012. According to an embodiment, the excess conductive material that may be present on the sidewalls 520, 650 may be removed using laser ablation, a selective etching process, or another process that is suitable for removing substantially all of the conductive material overlying at least those portions of the sidewalls 520, 650 that are adjacent to and/or between the package surface conductors 1010-1012. The above-described process results in the formation of distinct package surface conductors 1010-1012, where each package surface conductor 1010-1012 electrically couples the exposed ends 530, 640 of combinations of the device-to-edge conductors 302, 622, 624, 628. By establishing electrical connections between the device-to-edge conductors 302, 622, 624, 628, the package surface conductors 1010-1012 also serve to electrically interconnect the microelectronic packages 510, 610, 710 that are coupled with the device-to-edge conductors 302, 622, 624, 628.

For example, as shown in FIG. 10, a first package surface conductor 1010 electrically couples a first device-to-edge conductor 302 of microelectronic package 510 with a second device-to-edge conductor 624 of microelectronic package 610. Because the first package surface conductor 1010 electrically couples device-to-edge conductors 302, 624 of different microelectronic packages 510, 610, package surface conductor 1010 may be referred to as an "inter-package" package surface conductor. A second package surface conductor 1011 electrically couples a third device-to-edge conductor 622 on the bottom side of microelectronic package 610 with a fourth device-to-edge conductor 628 on the top side of microelectronic package 610. Because the second package surface conductor 1011 electrically couples device-to-edge conductors 622, 628 on the top and bottom of a single microelectronic package 610, package surface conductor 1011 may be referred to as a "top-side-to-bottom-side" package surface conductor. A third package surface conductor 1012 electrically couples a fifth device-to-edge conductor 622 on the bottom side of microelectronic package 610 with a sixth device-to-edge conductor 624 also on the bottom side of microelectronic package 610. Because the third package surface conductor 1012 electrically couples device-to-edge conductors 622, 624 on a same side of a single microelectronic package 610, package surface conductor 1012 may be referred to as an "inter-layer" package surface conductor.

In process 110, the package surface conductors 1010-1012 that were deposited during process 108 are cured. As used herein, the term "cure" means any process that causes deposited material (e.g., package surface conductors 1010-1012) to harden into a resilient solid structure, including sintering, exposing the material to chemical additives and/or gasses, and exposing the material to ultraviolet radiation, electron beams, or elevated temperatures. In an alternate embodiment, curing the package surface conductors 1010-1012 may be performed later (e.g., in conjunction with process 112). In any event, whether the curing process is performed in conjunction with process 110 or later in conjunction with process 112, curing may include exposing the assembly to a temperature in a range of about 200 degrees Celsius (C) to about 300 degrees C. for a period of time that is sufficient for curing to occur. In other embodiments, curing may include exposing the assembly to a higher or lower temperature.

Although the Figures depict package surface conductors that extend in a vertical direction with respect to the package top and bottom surfaces (which are considered to be in horizontal planes), package surface conductors may extend in horizontal, diagonal, or other directions, as well, in other embodiments. Further, embodiments of the inventive subject matter may include devices in which adjacent conductors are formed on package surfaces other than sidewalls. For example, adjacent conductors may be formed on a top surface, a bottom surface, and/or on embedded surfaces (e.g., between package layers) of a microelectronic package. Accordingly, a "package surface," as used herein, may mean a sidewall, a top surface, a bottom surface, or an embedded surface. Further, a "package surface conductor," as used herein, may mean a conductor formed on a sidewall (e.g., a package sidewall conductor), a top surface, a bottom surface, or an embedded surface of a microelectronic package. For ease of illustration and explanation, however, the Figures and description depict and describe vertically-oriented package surface conductors that extend between device-to-edge conductors of stacked microelectronic packages (e.g., packages 510, 610). According to an embodiment, microelectronic packages 510, 610 are fabricated so that, once they are assembled together to form a microelectronic package assembly, pairs of sidewall pads (i.e., the exposed distal ends of a pair of the device-to-edge conductors) generally align with each other in a vertical direction. However, as package surface conductors may have non-linear shapes and/or non-vertical orientations, the sidewall pads within a pair may not be aligned with each other in a vertical direction, in other embodiments.

Figure 11:
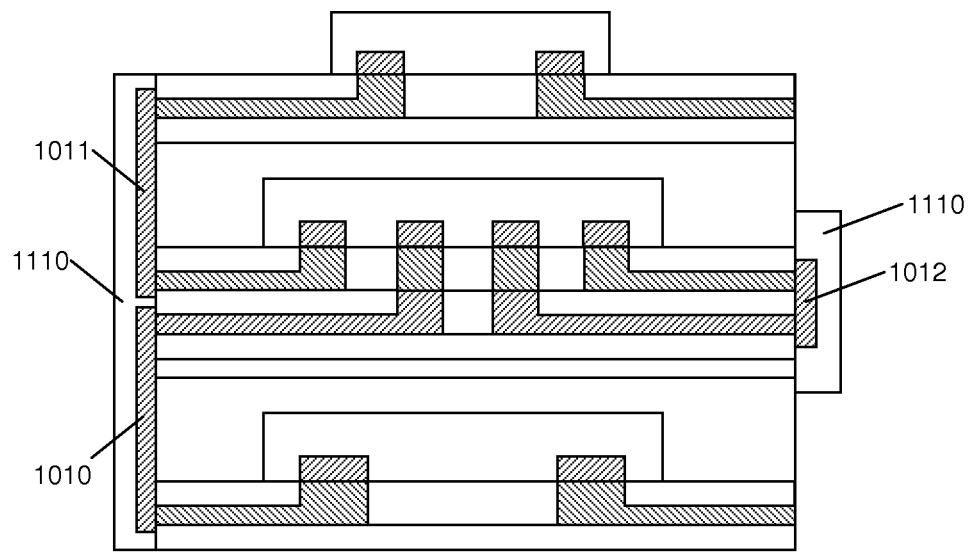
FIG. 11 illustrates a cross-sectional, side view of the partially-completed, stacked microelectronic package assembly of FIG. 10 after application of a protective coating over the package surface conductors, according to another embodiment.

Referring again to FIG. 1, in processes 112, a conformal protective coating 1110 is applied over the package surface conductors 1010-1012. For example, FIG. 11 illustrates a cross-sectional, side view of the partially-completed, stacked microelectronic package assembly of FIG. 10 after application of a protective coating 1110 over the package surface conductors 1010-1012, according to a further embodiment. According to various embodiments, the protective coating 1110 may be formed from a material that provides mechanical stability and/or a moisture barrier for the package surface conductors 1010-1012. According to a further embodiment, the protective coating 1110 is formed from a material that is electrically insulating. In an alternate embodiment, portions of the protective coating 1110 that extend parallel to the package surface conductors 1010-1012 may be formed from a conductive material, as long as the conductive portions of the protective coating 1110 do not produce undesired electrical shorting between the package surface conductors 1010-1012. Further, the protective coating 1110 may function to prevent dendrite growth (e.g., silver dendrite growth, when the package surface conductors 1010-1012 include silver). For example, the protective coating 1110 may include one or more materials selected from silicone, urethane, parylene, or other suitable materials. According to an embodiment, the protective coating 1110 may have a thickness in a range of about 10 microns to about 100 microns, although the protective coating 1110 may be thicker or thinner, as well.

After applying the protective coating 1110, the protective coating 1110 may be cured. In an embodiment in which the package surface conductors 1010-1012 were not cured in conjunction with process 108, curing of the protective coating 1110 may include exposing the assembly to a temperature in a range of about 150 degrees C. to about 300 degrees C. for a period of time that is sufficient for curing to occur. In an embodiment in which the package surface conductors 1010-1012 were cured in conjunction with process 108, curing may include exposing the assembly to a temperature in a range of about 50 degrees C. to about 80 degrees C. In other embodiments, curing may include exposing the assembly to a higher or lower temperature. In still another alternate embodiment, curing may merely include allowing the assembly to remain undisturbed at ambient temperature for a period of time that is sufficient to allow the protective coating 1110 to cure.

The embodiments of assemblies and methods of their fabrication described above include embodiments in which sidewall conductors 1010-1012 are applied directly to the substantially planar surfaces of the microelectronic packages 510, 610. In other embodiments, cavities, openings, or trenches that extend between device-to-edge conductors may first be formed in the package surfaces prior to forming the sidewall conductors. In still other embodiments, cavities, openings, or trenches may be formed in the package surfaces between adjacent sidewall conductors to decrease the possibility of shorts between the adjacent sidewall conductors. In still other alternate embodiments, dielectric structures may be formed between adjacent sidewall conductors to decrease the possibility of shorts between the adjacent sidewall conductors.

In addition, although the above described figures depict stacked microelectronic package assemblies in which sidewalls (e.g., sidewalls 520, 650) of the packages are substantially co-planar, the sidewalls of stacked packages forming a stacked microelectronic package assembly may not be coplanar, in other embodiments. For example, FIG. 12 illustrates a cross-sectional, side view of a completed stacked microelectronic package assembly, according to another embodiment. In the embodiment illustrated in FIG. 12, the width of top microelectronic package 1210 is smaller than the width of bottom microelectronic package 1220. In such an embodiment, package surface conductors 1230 between exposed ends 1202, 1204 of device-to-edge conductors 1216, 1226 can be formed in a stair step configuration. More particularly, in the illustrated embodiment, package sidewall conductors 1232, 1234 rise along the sidewalls of each microelectronic package 1210, 1220, and intermediate package surface conductors 1236 are formed on the top surface of the bottom microelectronic package 1220. The intermediate package surface conductors 1236 extend between and electrically couple corresponding pairs of package sidewall conductors 1232, 1234. As with the previously described embodiments, the exposed ends 1202, 1204 of device-to-edge conductors 1216, 1226 may be treated to prevent oxidation prior to forming the package surface conductors 1230. In addition, after formation of the package surface conductors 1230, a protective coating 1240 may be applied over the package surface conductors.

Although the above described figures depict package sidewalls that are substantially orthogonal to the top and bottom surfaces of a package, the package sidewalls may be non-orthogonal to the top and bottom surfaces of a package, in other embodiments. For example, FIG. 13 illustrates a cross-sectional, side view of a partially-completed stacked microelectronic package assembly with package surface conductors 1330 formed on non-orthogonal sidewalls of microelectronic packages 1310, 1320, according to yet another embodiment. As with the previously-described embodiments, each package surface conductor 1330 electrically couples exposed ends 1302, 1304 of at least two device-to-edge conductors 1316, 1326. Implementation of the various embodiments using devices (e.g., devices 1310, 1320) with non-orthogonal sidewalls may have some manufacturing advantages. For example, in an embodiment in which the sidewall conductors 1330 are dispensed using a print head, the print head may be positioned vertically during the dispensing process (e.g., pointed straight down toward the sidewalls), rather than at a non-vertical angle, as would likely be implemented for dispensing sidewall conductors on sidewalls that are orthogonal to the top and bottom package surfaces. As with the previously described embodiments, the exposed ends 1302, 1304 of device-to-edge conductors 1316, 1326 may be treated to prevent oxidation prior to forming the package surface conductors 1330. In addition, after formation of the package surface conductors 1330, a protective coating 1340 may be applied over the package surface conductors.

Although the various embodiments illustrated in the Figures and described above include vertically-oriented package surface conductors that interconnect vertically aligned sidewall pads of stacked packages, other embodiments also or alternatively may include horizontally-oriented package surface conductors that interconnect horizontally aligned sidewall pads of a single microelectronic package or multiple microelectronic packages. In addition, other embodiments may include package surface conductors that interconnect sets of more than two sidewall pads, and/or package surface conductors having shapes that are different from simple linear shapes, as discussed previously. Further, in some embodiments, adjacent sidewall conductors may couple to one or more common sidewall pads. In addition, in still other alternate embodiments, a stacked microelectronic package assembly may include any number or combination of the package surface conductor embodiments discussed herein. All such embodiments are intended to be included within the scope of the inventive subject matter.

An embodiment of a method includes performing an oxidation inhibiting treatment to a first exposed end of a first device-to-edge conductor and a second exposed end of a second device-to-edge conductor, and forming a package surface conductor to electrically couple the first device-to-edge conductor and the second device-to-edge conductor. Performing the oxidation inhibiting treatment may be selected from applying an organic solderability protectant coating to the first and second exposed ends, and plating the first and second exposed ends with a conductive plating material. The method may further include applying a conformal protective coating over the package surface conductor, where the conformal protective coating may be selected from silicone, urethane, and parylene.

An embodiment of a device includes a package body having a package surface, a first device-to-edge conductor, and a second device-to-edge conductor, a package surface conductor which electrically couples the first device-to-edge conductor and the second device-to-edge conductor, and a conformal protective coating over the package surface conductor.

The device may further include an oxidation inhibiting material on exposed ends of the first and second device-to-edge conductors, where the oxidation inhibiting material is selected from an organic solderability protectant and a conductive plating material. The package surface conductor may be a top-side-to-bottom-side package surface conductor, an inter-layer package surface conductor, or an inter-package package surface conductor.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the disclosure are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical (e.g., mechanical) manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

While at least one embodiment has been presented in the foregoing Detailed Description, it should be appreciated that a vast number of variations exist. It should also be appreciated that the embodiment or embodiments are only examples, and are not intended to limit the scope, applicability, or configuration of the disclosure in any way. Rather, the foregoing Detailed Description will provide those skilled in the art with a convenient road map for implementing embodiments of the disclosure. It being understood that various changes may be made in the function and arrangement of elements described in an embodiment without departing from the scope of the disclosure as set-forth in the appended claims.

What is claimed is:

1. A method comprising:
performing an oxidation inhibiting treatment to a first exposed end of a first device-to-edge conductor that is exposed at a sidewall of a microelectronic package and to a second exposed end of a second device-to-edge conductor that is exposed at a sidewall of a microelectronic package; and
forming a package surface conductor over the sidewall to electrically couple the first device-to-edge conductor and the second device-to-edge conductor.

2. The method of claim 1, wherein performing the oxidation inhibiting treatment is selected from applying an organic solderability protectant coating to the first and second exposed ends, and plating the first and second exposed ends with a conductive plating material.

3. The method of claim 1, wherein forming the package surface conductor comprises dispensing one or more conductive materials between the first and second exposed ends using one or more dispensing methods selected from spraying, inkjet printing, aerosol jet printing, stencil printing, and needle dispense.

4. The method of claim 1, wherein the package surface conductor is formed from one or more conductive materials that are selected from an electrically conductive adhesive, conductive polymer, a polymer filled with conductive particles, a metal alloy, metal coated organic particles, metal coated ceramic particles, solder paste, solder-filled adhesive, nanoparticle-filled ink, a liquid metal, a metal-containing adhesive, a metal-containing epoxies, electrically-conductive pastes, indium, and bismuth.

5. The method of claim 1, wherein the first device-to-edge conductor is included within a first layer that is proximate a top surface of a microelectronic package, and the second device-to-edge conductor is included within a second layer that is proximate a bottom surface of the microelectronic package, and wherein the package surface conductor is a top-side-to-bottom-side package surface conductor.

6. The method of claim 1, wherein the first device-to-edge conductor is included within a first layer that is proximate a first surface of a microelectronic package, and the second device-to-edge conductor is included within a second layer that is proximate the first surface of the microelectronic package, and wherein the package surface conductor is an inter-layer package surface conductor.

7. The method of claim 1, further comprising:
forming a package body by stacking a first microelectronic package that has a first sidewall on a second microelectronic package that has a second sidewall, wherein the first sidewall forms a first portion of a surface of the package body, the second sidewall forms a second portion of the surface, the first microelectronic package includes an embedded first microelectronic device that is electrically coupled with the first device-to-edge conductor, the second microelectronic package includes an embedded second microelectronic device that is electrically coupled with the second device-to-edge conductor, and the package surface conductor is formed on the surface of the package body.

8. The method of claim 7, wherein the package surface conductor is an inter-package package surface conductor.

9. The method of claim 1, further comprising:
applying a conformal protective coating over the package surface conductor.

10. The method of claim 9, wherein the conformal protective coating is selected from silicone, urethane, and parylene.

11. A method comprising:
performing an oxidation inhibiting treatment to a first exposed end of a first device-to-edge conductor of that is exposed at a sidewall of a microelectronic package and to a second exposed end of a second device-to-edge conductor that is exposed at a sidewall of a microelectronic package by applying an organic solderability protectant coating to the first and second exposed ends; and
forming a package surface conductor over the sidewall to electrically couple the first device-to-edge conductor and the second device-to-edge conductor; and
applying a conformal protective coating over the package surface conductor.

12. The method of claim 11, wherein the conformal protective coating is selected from silicone, urethane, and parylene.

13. The method of claim 11, wherein forming the package surface conductor is selected from forming a top-side-to-bottom-side package surface conductor, forming an inter-layer package surface conductor, and forming an inter-package package surface conductor.

14. The method of claim 11, wherein the package surface conductor is formed from one or more conductive materials selected from an electrically conductive adhesive, conductive polymer, a polymer filled with conductive particles, a metal alloy, metal coated organic particles, metal coated ceramic particles, solder paste, solder-filled adhesive, nanoparticle-filled ink, a liquid metal, a metal-containing adhesive, a metal-containing epoxies, electrically-conductive pastes, indium, and bismuth.

\* \* \* \* \*